United States Patent [19]
Cliff

[11] Patent Number: 5,243,233
[45] Date of Patent: Sep. 7, 1993

[54] POWER ON RESET CIRCUIT HAVING OPERATIONAL VOLTAGE TRIP POINT

[75] Inventor: Richard Cliff, Milpitas, Calif.

[73] Assignee: Altera Corporation, San Jose, Calif.

[21] Appl. No.: 950,345

[22] Filed: Sep. 24, 1992

[51] Int. Cl.[5] .................. H03K 3/01; G06G 7/12
[52] U.S. Cl. ..................... 307/296.4; 307/296.5; 307/272.3; 307/491; 307/355; 307/356; 307/264
[58] Field of Search .................. 307/296.4–296.5, 307/272.3, 491, 355–356, 264

[56] References Cited

U.S. PATENT DOCUMENTS

| | | | |
|---|---|---|---|
| 4,140,930 | 2/1979 | Tanaka | 307/296.4 |
| 4,607,178 | 8/1986 | Sugie et al. | 307/272.3 |
| 4,902,910 | 2/1990 | Hsieh | 307/296.4 |
| 4,983,857 | 1/1991 | Steele | 307/272.3 |
| 5,136,181 | 8/1992 | Yukowa | 307/272.3 |

Primary Examiner—Margaret R. Wambach
Attorney, Agent, or Firm—Townsend and Townsend Khourie and Crew

[57] ABSTRACT

In an integrated circuit having circuit components such as SRAM cells requiring a finite voltage level for operation, a power on reset circuit includes one of the circuit components in its output so that a power on reset (POR) signal is generated upon power supply turn on and the POR signal is deasserted only after the circuit component becomes operational and responsive to a $\overline{POR}$ signal generated by the reset circuit.

10 Claims, 1 Drawing Sheet

5,243,233

POWER ON RESET CIRCUIT HAVING OPERATIONAL VOLTAGE TRIP POINT

BACKGROUND OF THE INVENTION

This invention relates generally to power on reset circuitry, and more particularly the invention relates to a power on reset circuit which has a trip point or deassertion point after power reaches an operational voltage level.

Electronics systems typically employ a number of integrated circuit components all operating from a common voltage power supply. When a system is initially turned on, a supply voltage can ramp up to full voltage over a period of time from less than a microsecond to over a hundred milliseconds. While the supply voltage is ramping up, reset circuits within the integrated circuits initialize the integrated circuits by initializing flip flops, registers and latches for example, so that the circuit has correct start up configuration when the power supply voltage reaches an operational level for all parts of the circuit required to work on start up.

By its nature, a power on reset circuit is usually process sensitive with the deassertion or trip point being a function of the threshold voltage, semiconductor body effect, and to a lesser extent the other characteristics of the transistors in the integrated circuits. Thus, there will always be some spread, typically more than a volt, for the deassertion level of the reset circuit. Too high an average level is undesirable because for some process parameter corners and temperatures the trip point may drift above the supply voltage, $V_{cc}$, and thus the reset circuit will never go low. Further, if the trip point is too high, the reset circuit can become sensitive to supply noise while the device is in operation and needlessly reset. Delay circuits have sometimes been used to ensure that the trip point is above the operational voltage level of the power supply. However, the supply ramp can vary greatly from application to application as noted above. If the deassertion level is too low then the reset circuit may turn off before the rest of the circuitry is operational whereupon the device could start up incorrectly in the wrong state.

The present invention ensures that the power on reset circuit always turns off or fires after the integrated circuit becomes operational.

SUMMARY OF THE INVENTION

In accordance with the invention, the power on reset circuit includes a circuit component which is representative of circuit components in the integrated circuit requiring the highest supply voltage for operation. The deassertion of the power on reset is delayed until the reset component in the reset circuit becomes operational whereupon all circuit components in the integrated circuit will be operational.

In an illustrative embodiment, a CMOS integrated circuit includes a static RAM memory (SRAM), and the writing of an SRAM cell requires the highest supply voltage for operation in the integrated circuit. Accordingly, an SRAM cell is included in the reset circuit so that a reset turn off signal is generated only after the SRAM cell is operational.

The invention and objects and features thereof will be more readily apparent from the following detailed description and appended claims when taken with the drawings.

DETAILED DESCRIPTION OF ILLUSTRATIVE EMBODIMENTS

Figure 1:
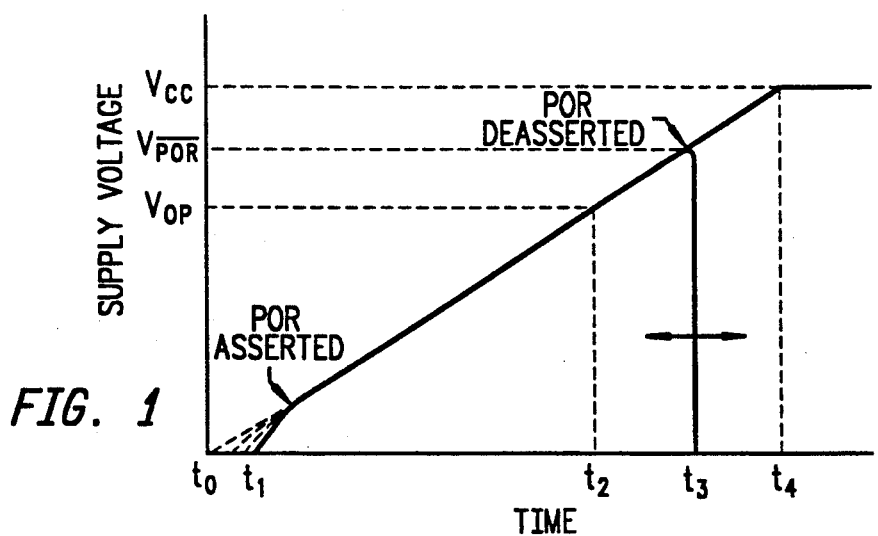
FIG. 1 is a plot illustrating supply voltage ramp versus time.

Referring now to the drawing, FIG. 1 is a plot illustrating supply voltage versus time after power on. The supply voltage ramps up to the full operating voltage, $V_{cc}$, over a period of time from less than one microsecond to 100 milliseconds. Many functional components in an integrated circuit do not become operational until the supply voltage reaches an intermediate level equal to the operating voltage, VOP. Thereafter all functional elements of the circuit are operational up to the full supply of voltage, $V_{cc}$.

As the supply voltage is ramping up and before VOP is reached, reset circuitry within the integrated circuit resets various components including flip flops, registers, and latches so that the circuit has a correct start up configuration or operational state when the operating voltage is reached. The power on reset (POR) signal is asserted shortly after the supply voltage is turned on and is deasserted or turned off ($\overline{POR}$) when the supply voltage reaches an intermediate level. As noted above, if the trip point is too low then the $\overline{POR}$ signal might be generated when the rest of the circuitry is still not operational and the device might not start up correctly. If the trip point is too high then the power on reset signal may never turn off.

The POR circuit by its nature is usually quite process sensitive with the trip point occurring over some spread (typically greater than a volt).

Figure 2:
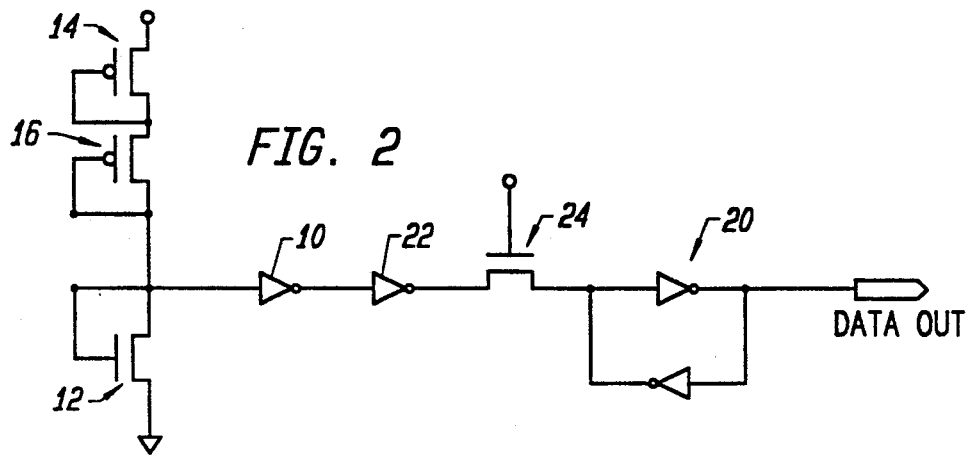
FIG. 2 is a schematic of a power on reset circuit in accordance with one embodiment of the invention.

FIG. 2 is a schematic of a power on reset circuit in accordance with one embodiment of the invention which ensures that the reset signal is tripped or turned off when the operating voltage, VOP, of circuit components is reached. Referring to FIG. 2 an inverter 10 generates a POR signal at its output for resetting or configuring a circuit upon power turn on. The input of the inverter 10 is connected through a leaky native transistor 12 to circuit ground with the transistor 12 functioning as a resistive interconnect. Two diode connected (common gate-drain connected) PMOS transistors 14 and 16 serially connect the supply voltage, $V_{cc}$, to the input of inverter 10. When the supply power starts to ramp up, transistor 12 connects the ground potential to the input of an inverter 10 with the inverter providing a positive output or POR signal shortly after the supply voltage begins ramping. The positive output is maintained until the supply voltage, $V_{cc}$, rises above the voltage drop, $PV_t$, of the two PMOS transistors, or two $PV_t$. It will be appreciated that the barrier voltage presented by the common drain-gate connected MOS devices can be increased by adding one or more series devices and can be reduced by removing one of the devices. When the voltage at the input of inverter 10 becomes positive the output goes to zero or $\overline{POR}$ which normally trips the reset signal.

In accordance with the invention, a circuit component shown generally at 20 is added to the power on reset circuit so that the $\overline{POR}$ signal is not generated until circuit components of the integrated circuit become operational. The output of inverter 10 is passed through a second inverter 22 and a pass transistor 24, which is biased on, and then to the input of the circuit component 20. In this embodiment the circuit component is equivalent to an SRAM cell and a ground or zero input to the SRAM cell 20 produces or writes a positive or one output. The writing of the SRAM cell is the last start up operation as the supply voltage ramps up.

Consider the case where the deassertion or trip point is lower than the supply voltage required to drive through the RAM cell. Initially the low input is passed through the RAM cell 20 forcing its output high. As the supply voltage rises and overcomes the barriers of devices 14, 16, a positive voltage is applied to the input of inverter 10 and the zero output is then inverted by inverter 22 with a positive voltage applied to cell 20. However, the supply voltage is not high enough to flip the cross-coupled inverters of the cell 20, and the output of the RAM cell stays high and remains so until the supply voltage reaches VOP which allows the data to pass through as $\overline{POR}$ to trip the reset. At this time the rest of the integrated circuit is operating correctly for the supply voltage.

Figure 3:
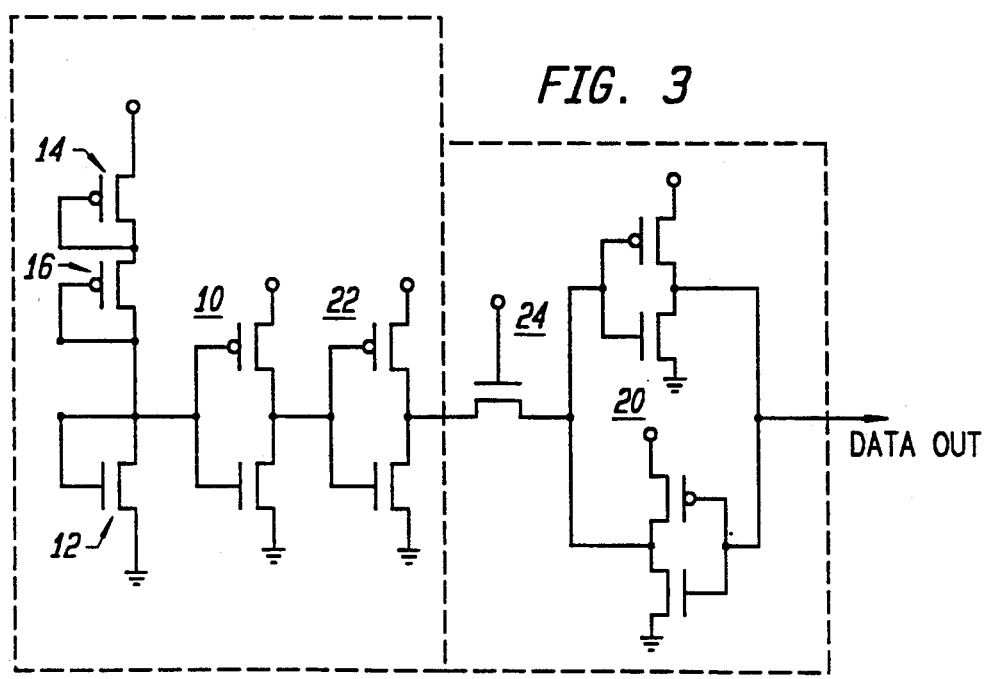
FIG. 3 is a more detailed schematic of the power on reset circuit of FIG. 1.

FIG. 3 is a more detailed schematic of the circuit of FIG. 2 implemented using CMOS circuitry. Like reference numerals are used in FIGS. 2 and 3. Each of the inverters comprises a CMOS transistor pair.

There has been described a power on reset circuit including a circuit component to ensure that the POR signal is tripped only after the integrated circuit becomes operational.

While the invention has been described with reference to CMOS integrated circuits using SRAM technology, the invention is applicable to other integrated circuits and technologies including EPROM and EEPROM. Thus, while the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A power on reset circuit for an integrated circuit having circuit components requiring a finite operating voltage level for operation and in which power supply voltage ramps up following power supply turn on, said power on reset circuit comprising:
 a reset signal terminal,
 logic means having an input terminal and an output terminal and responsive to an input voltage of a first level for generating a power on reset (POR) signal and responsive to an input voltage of a second level higher than said first level for generating a removal of the power on reset ($\overline{POR}$) signal,
 a power supply terminal and a circuit ground terminal,
 resistive means connecting said circuit ground terminal to said input terminal of said logic means,
 voltage barrier means connecting said power supply terminal to said input terminal of said logic means, said voltage barrier means being conductive to voltages above a barrier level at approximately said second level, and
 an output circuit connected to said power supply terminal and representative of a circuit component requiring the finite operating voltage level for operation, said output circuit connecting said output terminal of said logic means to said reset signal terminal, said output circuit providing a signal indicative of said power on reset (POR) signal to said output terminal until said output circuit becomes operational and responds to said removal of the power on reset ($\overline{POR}$) signal.

2. The power on reset circuit as defined by claim 1 wherein said integrated circuit comprises CMOS circuitry.

3. The power on reset circuit as defined by claim 2 wherein said output circuit comprises an SRAM cell.

4. The power on reset circuit as defined by claim 3 wherein said voltage barrier means comprises at least one common drain-gate connected MOS device.

5. The power on reset circuit as defined by claim 4 wherein said resistive means comprises a native transistor.

6. The power on reset circuit as defined by claim 2 wherein said voltage barrier means comprises at least one common drain-gate connected MOS device.

7. The power on reset circuit as defined by claim 2 wherein said resistive means comprises a native transistor.

8. For use in a power on reset circuit for an integrated circuit having circuit components requiring a finite voltage level for operation, said power on reset circuit connected to a power supply and providing a reset signal (POR) upon power turn on and a removal of the reset signal ($\overline{POR}$) after power voltage ramps to an intermediate level, means for ensuring said intermediate level is at least equal to said finite voltage level comprising an output circuit representative of said circuit components and connected to said power supply and receiving said reset signal, said output circuit providing a signal indicative of said reset (POR) signal until the power supply reaches said finite voltage level whereupon said output circuit is responsive in generating said removal of the reset signal.

9. Means as defined by claim 8 wherein said output circuit comprises CMOS circuitry.

10. Means as defined by claim 9 wherein said circuit components comprise SRAM cells.

* * * * *